(12) United States Patent
Holzmann et al.

(10) Patent No.: US 9,445,523 B2
(45) Date of Patent: Sep. 13, 2016

(54) ELECTRONIC ASSEMBLY WITH COOLING DEVICE

(75) Inventors: Gottfried Holzmann, Zorneding (DE); Werner Mittermaier, Erding (DE); Matthias Jelen, München (DE); Martin Roth, Starnberg (DE); Martin Oetjen, Gröbenzell (DE); Albert Moser, München (DE); Roland Mahr, Rosenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 710 days.

(21) Appl. No.: 13/808,901

(22) PCT Filed: Jul. 5, 2011

(86) PCT No.: PCT/EP2011/061342
§ 371 (c)(1),
(2), (4) Date: Jan. 7, 2013

(87) PCT Pub. No.: WO2012/004274
PCT Pub. Date: Jan. 12, 2012

(65) Prior Publication Data
US 2013/0114207 A1    May 9, 2013

(30) Foreign Application Priority Data
Jul. 7, 2010  (DE) .................. 10 2010 026 342

(51) Int. Cl.
*H05K 7/20* (2006.01)
*G06F 1/20* (2006.01)

(52) U.S. Cl.
CPC ................ *H05K 7/20* (2013.01); *H05K 7/207* (2013.01); *G06F 1/206* (2013.01)

(58) Field of Classification Search
None
See application file for complete search history.

(56) References Cited

U.S. PATENT DOCUMENTS 6,330,153 B1   12/2001  Ketonen
6,330,155 B1   12/2001  Remsburg
(Continued)

FOREIGN PATENT DOCUMENTS

| GB | 2402816 A | 12/2004 |
|----|-----------|---------|
| JP | 2-254797 A | 10/1990 |
| JP | 2001-91413 A | 4/2001 |

OTHER PUBLICATIONS

Philip Y. Paik, Vamsee K. Pamula, and Krishnendu Chakrabarty, "Adaptive Cooling of Integrated Circuits Using Digital Microfluidics", IEEE Transactions on Very Large Scale Integration (VSLI) Systems, vol. 16, No. 4, Apr. 2008, pp. 432-443.*

(Continued)

*Primary Examiner* — Kakali Chaki
*Assistant Examiner* — Walter Hanchak
(74) *Attorney, Agent, or Firm* — Christensen O'Connor Johnson Kindness PLLC

(57) ABSTRACT

The invention relates to an electronic assembly comprising a plurality of electronic component groups and a cooling device for cooling the electronic component groups. The cooling device provides a cooling-power distributor. A cooling power of the cooling device can be individually controlled by the cooling-power distributor for every component group. Furthermore, the assembly provides temperature-registering means for every component group for registering a temperature of every component group, and a load-determining device for determining a parameter for every component group which describes the load experienced by a component group on the basis of the temperature registered for this component group. A control unit controls the cooling-power distributor on the basis of the parameters determined for the component groups.

9 Claims, 3 Drawing Sheets

(56) References Cited

U.S. PATENT DOCUMENTS

| | | |
|---|---|---|
| 6,826,456 B1 | 11/2004 | Irving |
| 2006/0050464 A1* | 3/2006 | Von Arx ............... H01R 9/2425 361/104 |
| 2008/0312888 A1* | 12/2008 | Vinson ..................... G06F 1/20 703/2 |

OTHER PUBLICATIONS

Patrick W. Kalgren, Mark Baybutt, Thomas Dabney, Antonio Ginart, Chris Minnella, Michael J. Roemer, "Application of Prognostic Health Management in Digital Electronic Systems", Aerospace Conference, 2007 IEEE, Mar. 10, 2007, pp. 1-9.*

S. Mathew, P. Rodgers, V. Eveloy, N. Vichare, and M. Pecht, "A Methodology for Assessing the Remaining Life of Electronic Products", International Journal of Performability Engineering, vol. 2, No. 4, Oct. 2006, pp. 383-395.*

International Search Report mailed Dec. 12, 2011, issued in corresponding International Application No. PCT/EP2011/061342, filed Jul. 5, 2011, 16 pages.

International Preliminary Report on Patentability mailed Jan. 7, 2013, issued in corresponding International Application No. PCT/EP2011/061342, filed Jul. 5, 2011, 7 pages.

* cited by examiner

ELECTRONIC ASSEMBLY WITH COOLING DEVICE

The invention relates to an electronic assembly comprising a plurality of electronic component groups with a cooling device for cooling the electronic component groups and a method for cooling electronic component groups.

Electronic component groups in electronic assemblies heat up during operation and must be cooled. This is normally achieved by means of a fan in the electronic assemblies. It is known that the anticipated, average operating life of each component group can be calculated, and the distribution of cooling power can be adapted to this in an invariable manner through design measures. The failure of the electronic assembly is determined by the first failure of an electronic component group. Accordingly, the cooling power, which is supplied relatively to each component group, is calculated corresponding to the sensitivity and the anticipated load on the individual component groups. However, if one electronic component group in an electronic assembly is excessively loaded, the static supply of cooling power to the other component groups is excessive for such operating behaviour and insufficient for the heavily loaded component group. Furthermore, in the case of programmable component groups, it is not possible, in some cases, to calculate an anticipated cooling requirement, because the development of heat is dependent upon the software of the programmable component group.

The object of the invention is to remove the disadvantages of the prior art and provide an electronic assembly, of which the cooling device is suitable for cooling electronic component groups appropriately for every operating behaviour.

This object is achieved by the electronic assembly according to the invention as specified in claim 1 and by the method according to the invention for cooling electronic component groups as specified in claim 9.

The electronic assembly according to the invention comprises a plurality of electronic component groups and a cooling device for cooling the electronic component groups. The electronic assembly further comprises temperature-registering means for each component group for registering a temperature which predominates in the respective component group. The electronic assembly comprises a load-determining device for determining a parameter for each component group which describes the load experienced by a component group. The parameter for the respective component group is determined on the basis of the temperature registered for this component group. The cooling device comprises a cooling-power distribution, which is suitable for distributing a (total) cooling power of the cooling device to the component groups. A control unit of the electronic assembly is suitable for distributing the cooling power to the component groups on the basis of the parameters determined for the component groups by controlling the cooling-power distribution.

The method according to the invention for cooling a plurality of electronic component groups comprises the following steps: firstly, a temperature is registered individually for each component group. From each temperature of one of the component groups, a parameter is determined for the component group associated with the temperature, wherein the parameter for each component group indicates the load experienced by this component group. The parameter is determined on the basis of the temperature registered for this component group. Following this, a cooling power is distributed to the component groups on the basis of the parameters determined for the component groups.

The temperature of the electronic component groups is the determining value for the load on the electronic component groups, primarily with regard to their semiconductor components. By registering the temperature of each individual component group individually, the load on each component group can be calculated individually and expressed, in each case, through a parameter. Now, the invention has the advantage that, during normal operation, the cooling power of the individual component groups can be automatically matched in an adaptive manner to unforeseen loads or changes in the load on the component groups, and accordingly, the total load of the electronic assembly can be reduced. The distribution of the cooling power to the individual component groups of the electronic assembly according to the invention is therefore optimally matched with regard to every operating-behaviour.

The dependent claims relate to advantageous further developments of the invention.

In particular, it is advantageous that the load-determining device is suitable for determining the parameter for each component group on the basis of an acting time of the temperature registered for this component group, which is determined from the temperature characteristic of the component group. Accordingly, the parameter for the load can be determined in a particularly accurate manner, because the operating time of the component group is taken into consideration in the calculation of the parameter together with a temperature evaluation of this operating time. Accordingly, the total temperature characteristic experienced, that is, at least the temperature characteristic of a component group experienced during the operating time of the component group, can be taken into consideration in the calculation of the parameter for the load on this component group.

It is advantageous that the electronic assembly provides an input unit for entering user interactions. This is connected to the control unit. The control unit is embodied in such a manner that the temperature characteristic of one of the component groups is deleted following the entry of a given user interaction. Accordingly, it is possible for a user to delete the temperature characteristic of a component group, for example, if it has been replaced or serviced. Accordingly, the adaptive cooling can also be improved after the replacement of a component group.

It is also advantageous that the load-determining device is suitable for re-determining the parameter of each component group at periodic intervals, and the control unit is suitable for matching the distribution of the cooling power to the component groups on the basis of the re-determined parameters of the component groups. As a result of the periodic re-determination of the load, the parameter for the load of the individual component groups can be kept up-to-date and the adjusted cooling power for each component group can be updated at any time on the basis of the load experienced.

Furthermore, it is advantageous that the parameter for each component group is the estimated residual-operating life for this component group. In the context of the invention described, the residual-operating life of a component group or of the assembly is defined as the time remaining until the next time it fails. The mean residual-operating life of component group can be calculated from the mean time between two failures ("Mean Time Between Failure", MTBF) and the operating time experienced by the component group, wherein the MTBF can be calculated from the temperature registered for the component group. The residual-operating life is particularly advantageous as a parameter, because it is the most important parameter for the next failure of the component group and has special predictive force both for the control algorithm and also for a user. For the description, reference is generally made to the failure of a component group. However, a time until the next servicing deadline (for example, re-calibration) can also be considered instead of the time until failure.

Moreover, it is advantageous to improve the estimated residual-operating life of each component group by taking into consideration the cooling power adjusted for this component group and the associated, anticipated future development of heat. Accordingly, the accuracy of the estimated residual-operating life can be further improved, and an early failure of the electronic assembly through the failure of a component group can thus be avoided in an improved manner.

It is particularly advantageous to control the cooling power for every component group in such a manner that the residual-operating life of the electronic assembly calculated from the estimated residual operating lives of the component groups is maximal.

A further advantage is obtained by outputting the determined parameters for the load of the individual component groups. Accordingly, it is possible to notify the user of the device or personnel responsible for servicing the electronic assembly with regard to the wear and load on the individual component groups and/or the mean residual-operating life of the individual component groups. In this manner, an overloaded component group can be replaced in good time, thereby further reducing the cooling power for the replaced component group, which was increased at the cost of the cooling power for the other component groups. Accordingly, the total operating life of the device can be further prolonged, because the user or service personnel can be notified of a specific component group at risk of failure, and this can be replaced in good time before the changed cooling power also shortens the residual-operating life of the other component groups.

With regard to the invention, the distribution of the cooling power is understood to mean any control of the cooling power for the individual component groups, which can alter the cooling power for at least one of these component groups relative to the cooling powers of the other component groups. In this case, the total cooling power need not necessarily be constant. However, the invention is particularly relevant with regard to a maximal, total cooling power.

Two preferred exemplary embodiments of the invention are described below with reference to the drawings. The drawings are as follows.

Figure 1:
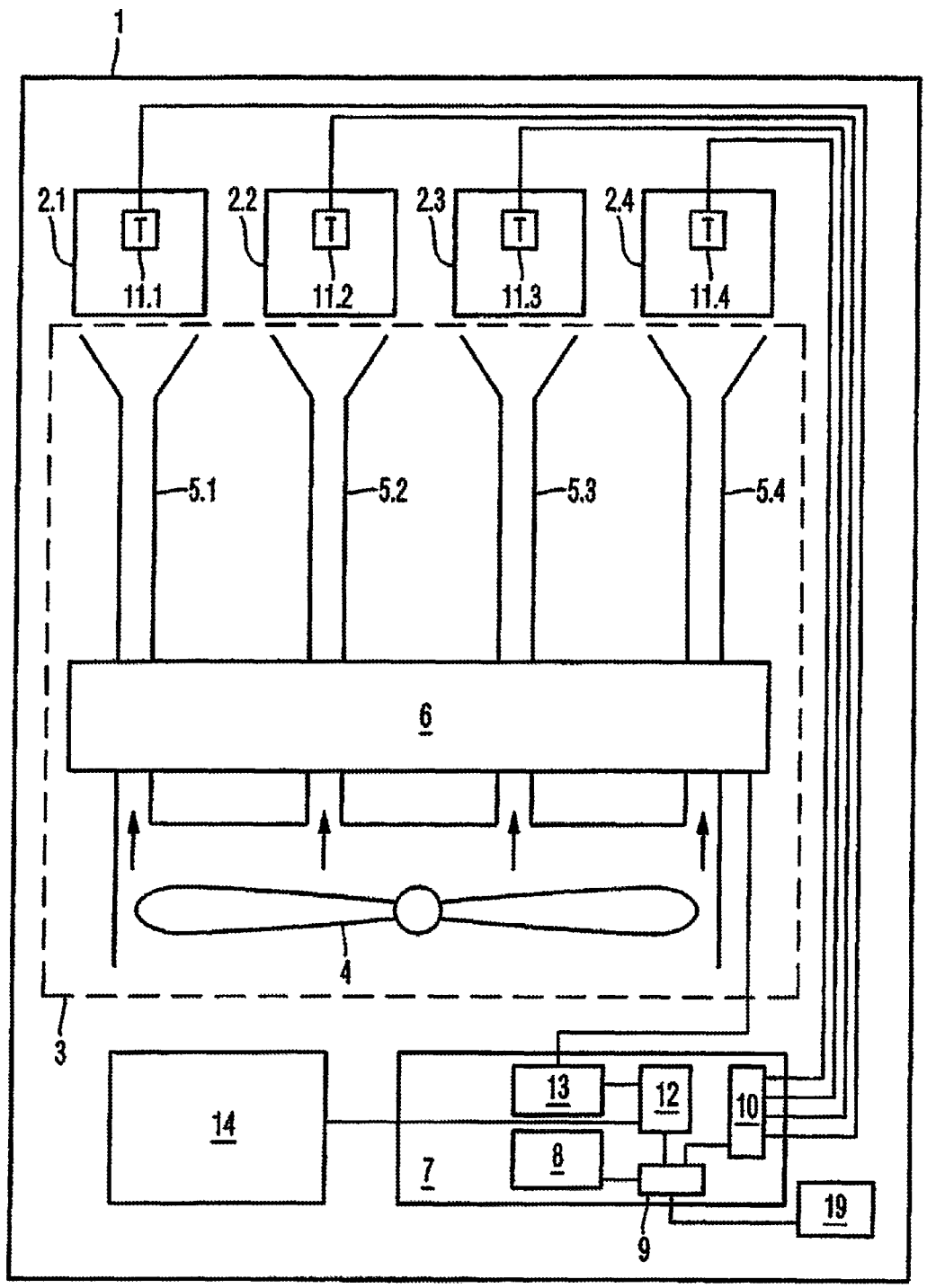
FIG. 1 shows a schematic view of a first exemplary embodiment of the electronic assembly according to the invention.

FIG. 1 shows a first exemplary embodiment of the electronic assembly according to the invention. The electronic device 1, as the electronic assembly, provides four electronic component groups 2.1, 2.2, 2.3 and 2.4, as the plurality of electronic component groups. The invention is not limited to four electronic component groups 2.1 to 2.4 but is suitable for any number ≥2 of electronic component groups to be cooled. In this context, the component groups could be configured in the same manner or differently. An electronic component group is normally built up from a plurality of connected electronic components, so that this component group fulfils at least one function in the device 1. However, a component group can also consist of only one electronic component. In this exemplary embodiment, the component groups 2.1 to 2.4 comprise semiconductors made of gallium arsenide (GaAs) as electronic components, which are particularly temperature-sensitive and of which the residual-operating life depends very heavily upon the temperature experienced.

Furthermore, the device 1 comprises a cooling device 3. The cooling device 3 provides a fan 4 and airstream supply lines 5.1, 5.2, 5.3 and 5.4, which lead respectively to precisely one corresponding component group 2.1, 2.2, 2.3 and 2.4. The airstream supply lines 5.1 to 5.4 can comprise pipes or other airstream supply lines, as indicated schematically in FIG. 1, which are each closed off relative to the other airstream supply lines. The fan 4 draws air from outside and guides it through the airstream supply lines 5.1 to 5.4 towards the electronic component groups 2.1 to 2.4. As an alternative, it is also possible for the fan 4 to draw the heated air away from the component groups 2.1 to 2.4 via the airstream supply lines 5.1 to 5.4. The total cooling power of the cooling device 3 is therefore limited by the power of the fan and the temperature of the air drawn in. Furthermore, the cooling device 3 provides a flap system 6 as a cooling-power distribution for the individual, and also partial, opening and closing of the airstream supply lines 5.1 to 5.4. Through the degree of opening of the individual airstream supply lines 5.1 to 5.4, the flap system 6 distributes the total airstream volume of the fan 4 in a relative manner to the individual component groups 2.1 to 2.4 as a total cooling power. The degree of opening of an airstream supply line 5.1 to 5.4 is realised through the degree of opening of a flap in the respective airstream supply line 5.1 to 5.4. Each of the four flaps of the four airstream supply lines 5.1 to 5.4 is individually controllable by a servo motor. Accordingly, the degree of opening of each airstream supply line 5.1 to 5.4 can be controlled individually. As an alternative, the flaps can also be controlled magnetically.

The device 1 is controlled by a control unit 7. The control unit 7 controls the individual component groups 2.1 to 2.4 on the basis of user entries. By way of simplification, the control connection between the control unit 7 and the individual component groups 2.1 to 2.4 is not shown in FIG. 1. The control unit 7 provides an operating-time counter 8 as the operating-life determining device. For each component group 2.1 to 2.4, the operating-time counter 8 measures an operating time which specifies the time, during which each component group 2.1 to 2.4 was in operation. The respective operating time of the individual component groups 2.1 to 2.4 is stored in a memory 9 and updated regularly during operation of the device 1 by the operating-time counter 8. The operating-time counter 8 obtains the information regarding whether a component group 2.1 to 2.4 is in operation from the control unit 7 which controls the component groups 2.1 to 2.4.

A temperature-determining unit 10 and temperature sensors 11.1 to 11.4 form a temperature-registering device. The temperature unit 10 is connected to the temperature sensors 11.1 to 11.4 in the component groups 2.1 to 2.4. Each component group 2.1 to 2.4 provides respectively one temperature sensor 11.1 to 11.4 which specifies the current temperature of this component group 2.1 to 2.4 to the temperature-determining unit 10. The temperature-determining unit 10 stores the temperature characteristics of the individual component groups 2.1 to 2.4 in the memory 9 and updates them regularly during the operation of the device 1.

The temperature characteristic of one of the component groups 2.1 to 2.4 comprises the temperature of this component group 2.1 to 2.4 over the operating duration since the component group was first switched on. The operating duration is thus a relative time which is counted upwards or downwards only during the operation of the component group 2.1 to 2.2. The temperature characteristic is recorded and stored or updated in the memory 9. In this manner, a measured temperature can be stored, for example, for every operating second. Alternatively, the temperature characteristic of one of the component groups 2.1 to 2.4 could comprise the measured temperatures with the absolute measuring times associated with the temperatures. In this case, the temperature characteristic for the entire operating time is recorded with a given sampling rate and stored in the memory 9. Alternatively, the temperature of the individual component groups 2.1 to 2.4 can also be registered without temperature sensors 11.1 to 11.4 in an alternative temperature-registering device, for example, through a calculated temperature determination based on control currents and voltages and the components involved. This could be achieved, for example, through a pre-determined characteristic or matrix of the input parameters, the adjusted cooling power and the measured temperature. In this case, a common, external measured temperature can also be included.

On the basis of the operating life and the temperature characteristics of a component group 2.1 to 2.4, a residual operating-life determining device 12, as the load-determining device of the control unit 7, calculates the residual-operating life of the respective component group of the component groups 2.1 to 2.4. In the context of the component group 2.1, the following section describes the calculation of the residual-operating life for the component group 2.1, which is used here without limitation of the invention with regard to the residual operating lives of the other component groups 2.2 to 2.4. First, the MTBF of the component group 2.1 is calculated from the temperature characteristic for the component group 2.1 contained in the memory 9. In the exemplary embodiment, the MTBF of the component group 2.1 is determined through the MTBF of the GaAs-semiconductor in the component group, because the semiconductor 2.1 provides the highest failure rate. The MTBF (T1) of a component group with an operating temperature of T1

$$MTBF(T1) = MTBF(T0) \cdot e^{\frac{E}{k}(\frac{1}{T1} - \frac{1}{T0})}$$

is calculated from the known MTBF(T0) at a reference temperature T0. The reference temperature can be, for example, room temperature. MTBF (T0) can be determined empirically or can be calculated. In this context, E is the activation energy of a GaAs-semiconductor, which is disposed between 1.2 eV and 1.9 eV, and k is the Boltzmann constant. Since the component group is exposed to different temperatures during the operating time, and the temperatures are not included in the MTBF in a linear manner, the total temperature range, to which the component group 2.1 was exposed is subdivided into a number N of equally large temperature ranges, in each case with a mean temperature $T_i$ where i=1, ..., N. The time duration $t_i$ for which the component group 2.1 was exposed to temperatures of the temperature range with the mean temperature $T_i$ is determined from the temperature characteristic of the component group 2.1. This is determined for all N temperature ranges. If the time durations $t_i$ are scaled so that the sum of all $t_i$ corresponds to one, the relative proportion $n_i$ of the previous total operating durations for the component group 2.1 is obtained, in which the component group 2.1 was exposed to temperatures of the temperature range with the mean temperature $T_i$. The MTBF of the component group 2.1 is then obtained as:

$$MTBF_{2.1} = \sum_{i=1}^{N} n_i \cdot MTBF(T_i)$$

from the sum of the $MTBF(T_i)$ weighted with $n_i$. Further data for the calculation are contained in the memory 9. Relevant data for estimating the residual-operating life as a parameter for the load on a component group can be the components involved, which provide different sensitivity to temperature and different operating lives, and the calculation methods for the components involved or respectively for the total component group 2.1.

In an alternative exemplary embodiment, the $MTBF_{2.1}$ can be further improved by taking into consideration the adjusted cooling power and the associated, anticipated future temperature development with a similar use of the component group 2.1 for the calculation of the $MTBF_{2.1}$ as in the past. Furthermore, the estimation of the mean residual-operating life of the individual component groups 2.1 to 2.4 can take into consideration whether a component group 2.1 to 2.4 has just been replaced and is therefore new. New components initially have a higher probability of failure. This could be taken into consideration in the MTBF calculation with a reducing newness factor in the load-determining device, by multiplying the MTBF of the new component group by the newness factor. Such a newness factor can be used in the load-determining device for the first operating hours of the new component group. In a particularly simple further alternative exemplary embodiment, the MTBF could also be calculated from a mean temperature of the temperature characteristic of the component group 2.1. In fact, this is not so accurate, because the non-linearity of the influence of the temperature is not taken into consideration, but it does, at least, provide a qualitatively correct result, wherein a reduced calculation capacity is required in the control unit 7. The mean residual-operating life of the component group 2.1 can be calculated from the MTBF after deducting the operating life experienced by the component group 2.1; that is to say, the residual-operating life of the component group 2.1 can be estimated.

The estimated residual operating lives of the individual component groups 2.1 to 2.4 are routed to a cooling power control 13. From the residual operating lives of the individual electronic component groups 2.1 to 2.4, the cooling power control 13 calculates the respective degree of opening of the airstream supply lines 5.1 to 5.4 of the respective component groups 2.1 to 2.4 and re-routes the degree of opening of the individual airstream supply lines 5.1 to 5.4 to the flap system 6. The flap system 6 controls the flaps of the airstream supply lines 5.1 to 5.4 on the basis of the degrees of opening of the airstream supply lines 5.1 to 5.4 calculated by the cooling power control 13. In this context, the cooling power control 13 calculates the degrees of opening of the airstream supply lines 5.1 to 5.4 in such a manner that the residual-operating life of the device 1 is maximised. Since the residual-operating life of the device 1 is determined by the shortest residual-operating life of the component groups 2.1 to 2.4, it is particularly advantageous to calculate the degrees of opening of the airstream supply lines 5.1 to 5.4 in such a manner that the residual operating lives of the individual component groups 2.1 to 2.4 approximate one another, or at least the shortest residual-operating life of the component groups 2.1 to 2.4 is increased For this purpose, in the cooling power control 13, the flaps of the flap system 6, which controls the cooling power of the component groups which have a shorter residual-operating life than the mean residual-operating life of all component groups, are opened by one opening step, and/or the other flaps, or at least some of these, are closed by one opening step. An opening step is a previously determined minimum change in the cooling power for a component group 2.1 to 2.4. In the first exemplary embodiment, this corresponds to a change of the flap opening of the airstream supply line 5.1 to 5.4. The residual-operating life of the component groups is calculated at regular time intervals. If component groups continue to have a relatively shorter residual-operating life than the mean residual-operating life, the flaps for these component groups are opened by a further opening step and/or the flaps associated with the other component groups are closed by a further opening step. If the residual operating lives of the component groups approximate the mean residual-operating life, the flap openings are held constant. In this manner, the distribution of cooling power to the component groups can be matched individually to the use of the component groups by the user, and the operating life of the device 1 can be maximised.

In the cooling power control 13, the stops, that is, the maximal opening and closing angle of the flap of the airstream supply line 5.1 to 5.7, are taken into consideration in the control. Furthermore, the control takes into consideration that at least sufficient cooling power is allocated to the component groups 2.1 to 2.4 which provide a relatively longer residual-operating life than the average residual-operating life of all component groups 2.1 to 2.4, so that these component groups remain below a maximum temperature. This prevents an excessive cooling at the cost of other component groups as a result of exceeding a maximum temperature. Large differences between the residual operating lives of the individual component groups 2.1 to 2.4 can occur after the replacement of one component group 2.1 to 2.4 by a new one.

The residual operating-life determination 12 also routes the calculated residual operating lives to an output device 14. The output device 14 can comprise, for example, a screen or an interface, which can be opened by users or personnel responsible for servicing. In this manner, heavily loaded component groups can be recognised in good time and replaced preventively before the failure of the component group, thereby avoiding an unexpected failure of the device 1. Through the adaptive matching of the cooling power of the individual component groups on the basis of the residual-operating life of these component groups, the total operating life of the device 1 can be maximised for every type of use of the individual component groups 2.1 to 2.4.

Furthermore, the device 1 provides an input unit 19, by means of which a user or service personnel can store in the memory 9 of the control unit 7 the fact that a given component group has been replaced. In consequence of such a replacement of a component group, the old temperature characteristic of this component group is deleted and a new one is opened. Moreover, the operating-time counter 8 for this component group is reset to 0. With such an input unit 19, a correct, individually matched cooling power control can be guaranteed after the replacement of a component group.

Figure 2:
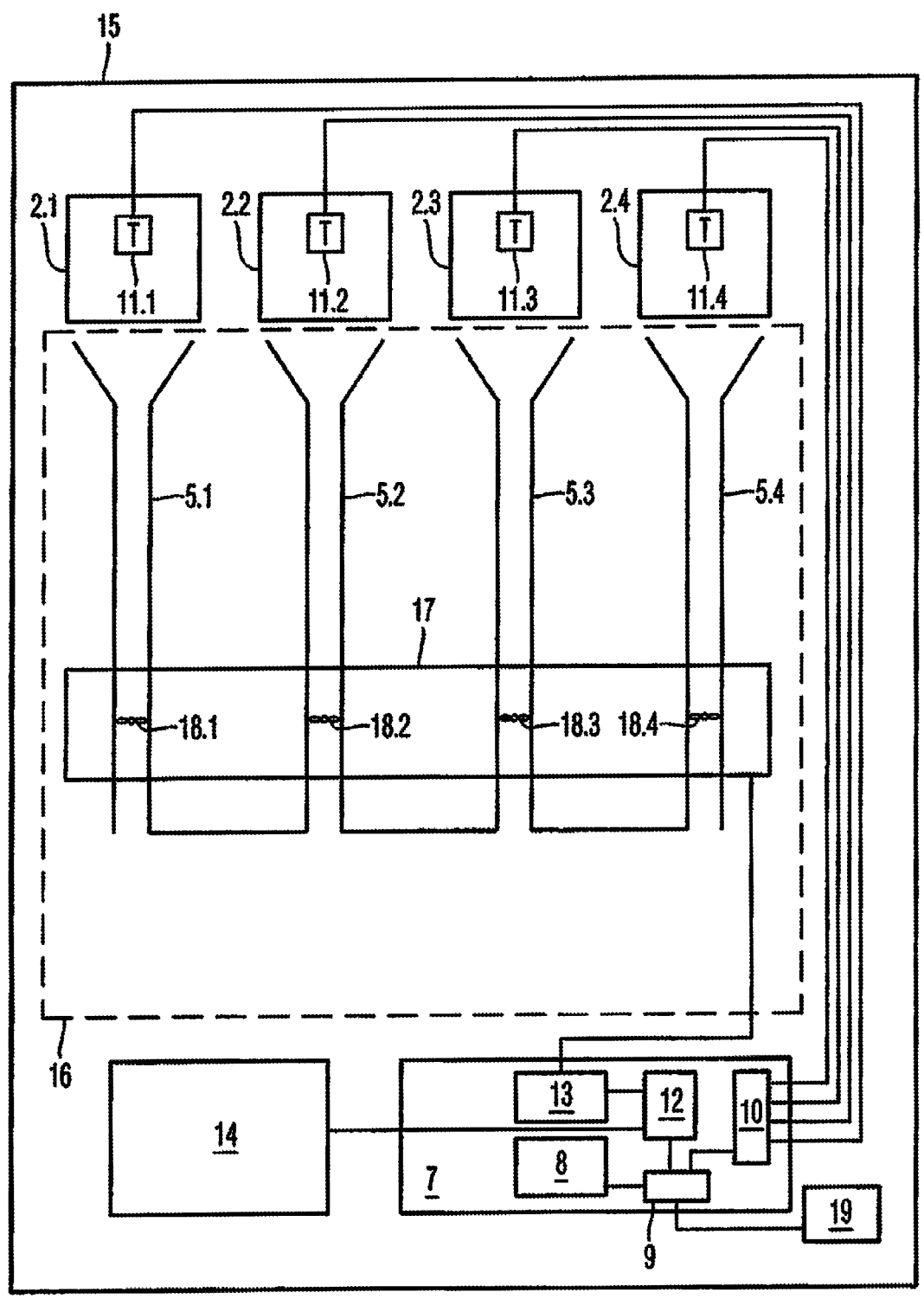
FIG. 2 shows a schematic view of a second exemplary embodiment of the electronic assembly according to the invention.

FIG. 2 shows an alternative exemplary embodiment of the electronic assembly according to the invention. The device 15 is structured like the device 1. Identical parts of the device 15 are therefore defined with the same reference numbers and will not be described again. The cooling device 16 differs from the cooling device 3 in that the cooling power for the individual component groups 2.1 to 2.4 is generated individually in the cooling-power distributor 17 by four individual fans 18.1 to 18.4. Each fan 18.1 to 18.4 generates the cooling power for a component group 2.1 to 2.4. The cooling-power distribution 17 distributes the electrically generated cooling power to the four fans 18.1 to 18.4 corresponding to the cooling power control unit 13. Alternatively, the fans 18.1 to 18.4 can be arranged directly on the component groups. Instead of distributing a fixed, total airstream volume to the individual component groups 2.1 to 2.4 as the total cooling power, as in the first exemplary embodiment, the total electrical cooling power in the second exemplary embodiment is subdivided between the four fans 18.1 to 18.4.

The invention is not restricted to air cooling, but can also be realised by controlling a supply of another cooling medium, such as water. Accordingly, the invention requires a cooling device, which can control the cooling power in an individual manner for the individual component groups 2.1 to 2.4. This can be controlled through the total cooling power and its proportional distribution to the individual component groups 2.1 to 2.4.

Figure 3:
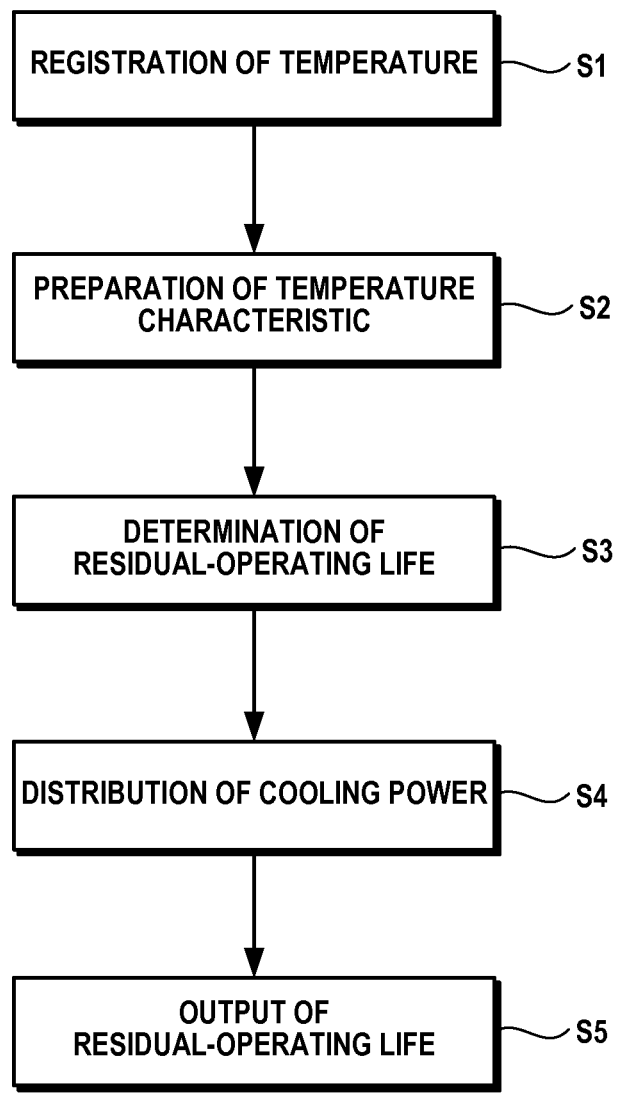
FIG. 3 shows a flow diagram with the steps of the method according to the invention for cooling electronic component groups.

FIG. 3 shows the steps of the method according to the invention for cooling a number of electronic component groups 2.1 to 2.4. In step S1, the temperature of each component group is registered, and in step S2, a temperature characteristic for every component group 2.1 to 2.4 is generated or completed from the temperature registered. In a third step S3, the residual-operating life for every component group 2.1 to 2.4 is estimated, as described above, from the temperature characteristic. On the basis of the estimated residual operating lives of the component groups 2.1 to 2.4, the cooling power for every component group 2.1 to 2.4 is adjusted or distributed individually, in step S4, in such a manner that the total residual-operating life of all component groups 2.1 to 2.4 is maximised. Optionally, in step S5, the calculated, different, mean residual-operating life for each component group 2.1 to 2.4 can be output on a screen or via an interface.

If a function for the residual-operating life $t_{Rest}$ dependent upon the cooling powers of the four component groups 2.1 to 2.4 can be plotted, an optimal cooling power distribution can be generated by maximising this function dependent upon the cooling-power distribution.

Alternatively, it is also possible, in the first and second exemplary embodiment, not to use the residual-operating life as the parameter for the load of the individual component groups 2.1 to 2.4. For example, one alternative would be to weight the operating time of a component with the temperature experienced, for example, by integrating the scaled temperature characteristic for the component group over the operating time. If the temperature characteristic below a predetermined temperature which no longer represents a load for the component group is set to 0, the operating time can be determined directly from the temperature characteristic. As an alternative, the temperature can be considered only above a temperature which is damaging for the component group and shortens its operating life, or only the maximum temperature for a component group may be included.

The invention is not restricted to the exemplary embodiments described here. On the contrary, all of the alternatives can be advantageously combined with one another.

The invention claimed is:

1. An electronic assembly comprising: a plurality of electronic component groups; and a cooling device for cooling the electronic component groups, wherein
   a temperature-registering means is provided for each component group for the individual registration of a temperature of each component group;
   a load-determining device is provided for determining a parameter for each component group which describes the load experienced by a component group on the basis of the temperature registered for this component group;
   a cooling-power distributor is provided for distributing a cooling power of the cooling device to the component groups; and
   a control unit is provided for controlling the distribution by the cooling-power distributor on the basis of the determined parameters of the component groups, wherein the parameter for each component group is the estimated residual-operating life of the respective component group, and the load-determining device is suitable for determining the parameter for each component group on the basis of the temperature characteristic experienced by this component group,
   wherein the load-determining device is suitable for re-determining the parameter for every component group at periodic intervals, and the control unit is suitable for controlling the cooling-power distributor in such a manner that the cooling power is distributed to the component groups on the basis of the re-determined parameter for the component groups.

2. The assembly according to claim 1,
   wherein an input unit for entering user interactions connected to the control unit, wherein the control unit is embodied in such a manner that the temperature characteristic of one of the component groups is deleted in consequence of the entry of a given user interaction.

3. The assembly according to claim 1,
   wherein the load-determining device is suitable for estimating the residual-operating life of each component group on the basis of the adjusted cooling power for this component group.

4. The assembly according to claim 3,
   wherein the control unit is suitable for controlling the cooling-power distributor so that the cooling power is distributed to the component groups in such a manner that the residual-operating life of the electronic assembly determined from the residual operating lives of the component groups is maximal.

5. The assembly according to claim 1,
   wherein an output device is provided for outputting the parameters of the individual component groups.

6. A method for cooling a plurality of electronic component groups, comprising:
   determining a temperature for each component group;
   determining a parameter for each component group which describes the load experienced by a component group on the basis of the temperature registered for this component group; and
   controlling a distribution of a cooling power to the component groups on the basis of the parameters determined for the component groups, wherein the residual-operating life of each component group is estimated as the parameter for the respective component group, and the parameter for each component group is determined on the basis of the temperature characteristic experienced by the respective component group,
   wherein the parameter for each component group is re-determined at periodic intervals, and the distribution of the cooling power to the component groups is controlled on the basis of the re-determined parameter for this component group.

7. The method according to claim 6,
   wherein the residual-operating life of each component group is determined taking into consideration the adjusted cooling power for this component group.

8. The method according to claim 7,
   wherein the cooling power for each component group is controlled in such a manner that the residual-operating life of the electronic assembly determined from the residual operating lives of the component groups is maximal.

9. The method according to claim 6,
   further comprising outputting of the parameters for the individual component groups.

* * * * *